United States Patent
Mishra et al.

(10) Patent No.: US 12,265,122 B1
(45) Date of Patent: Apr. 1, 2025

(54) MEMORY PROFILER FOR EMULATION

(71) Applicant: Synopsys, Inc., Sunnyvale, CA (US)

(72) Inventors: Prashant Kumar Mishra, Karnataka (IN); Kiran Lokhande, Karnataka (IN); Mikhail Bershteyn, New York, NY (US); Srivatsan Raghavan, Karnataka (IN)

(73) Assignee: SYNOPSYS, INC., Sunnyvale, CA (US)

( * ) Notice: Subject to any disclaimer, the term of this patent is extended or adjusted under 35 U.S.C. 154(b) by 79 days.

(21) Appl. No.: 17/964,742

(22) Filed: Oct. 12, 2022

(51) Int. Cl.
  *G01R 31/3183* (2006.01)
  *G01R 31/317* (2006.01)
  *G01R 31/3181* (2006.01)

(52) U.S. Cl.
  CPC .......... *G01R 31/318314* (2013.01); *G01R 31/31722* (2013.01); *G01R 31/31813* (2013.01)

(58) Field of Classification Search
  CPC ...... G01R 31/318314; G01R 31/31722; G01R 31/31813; G06F 9/455; G06F 12/1416; G06F 11/3096; G06F 11/34; G06F 12/1441
  USPC .......................................... 714/724; 703/23
  See application file for complete search history.

(56) References Cited

U.S. PATENT DOCUMENTS

| | | | |
|---|---|---|---|
| 6,446,241 B1* | 9/2002 | Mobley | G11C 29/08 716/106 |
| 8,042,011 B2* | 10/2011 | Nicolaidis | G11C 29/56 365/201 |
| 9,990,452 B2* | 6/2018 | Suresh | G06F 1/3275 |
| 10,430,215 B1* | 10/2019 | Roy | G06F 9/455 |
| 11,113,440 B1* | 9/2021 | Varma | G06F 30/33 |
| 2009/0292523 A1* | 11/2009 | Birguer | G06F 9/45537 711/E12.086 |
| 2010/0275074 A1* | 10/2010 | Nicolaidis | G11C 29/16 714/E11.169 |
| 2017/0140083 A1* | 5/2017 | Suresh | G06F 30/331 |
| 2017/0140084 A1* | 5/2017 | Suresh | G06F 30/331 |
| 2017/0255728 A1* | 9/2017 | Wakefield | G06F 11/261 |
| 2018/0011956 A1* | 1/2018 | Kumar | G06F 30/331 |
| 2022/0066801 A1* | 3/2022 | Selvidge | G06F 9/455 |

* cited by examiner

*Primary Examiner* — Albert Decady
*Assistant Examiner* — Osman M Alshack
(74) *Attorney, Agent, or Firm* — WOMBLE BOND DICKINSON (US) LLP

(57) ABSTRACT

A method for determining a sparse memory size during emulation, the method including: determining, by a profiler memory coupled to a user memory, that one or more pages of the user memory are used by a first test sequence of a testbench during the emulation; identifying, by the profiler memory, a first set of indexes of the one or more pages of the user memory used by the first test sequence; determining a number of unique pages of the user memory that are used by the first test sequence for the emulation based on the first set of indexes; determining, by a processor, the sparse memory size for the user memory based on the number of unique pages of the user memory that are used by the testbench for the emulation and a page size of the user memory.

20 Claims, 11 Drawing Sheets

| Uniq Page-index for 2^10 | | Uniq Page-index for 2^11 | |
|---|---|---|---|
| Test Seq 1 | Test Seq 2 | Test Seq 1 | Test Seq 2 |
| 0 | 1 | 0 | 0 |
| 4 | 8 | 2 | 4 |
| 5 | 9 | 2 | 4 |
| 6 | 12 | 3 | 6 |
|   | 13 |   | 6 |
| # of Uniq Entries | 4 | 5 | 3 | 3 |
| Max Pages | 5 | | 3 | |

Table 1

FIG. 6

| Architecture | Emulation Platform A | | | Emulation Platform B | | | Emulation Platform C | | |
| --- | --- | --- | --- | --- | --- | --- | --- | --- | --- |
| Design | Ref (ns) | Sparse (ns) | Gain Ratio | Ref (ns) | Sparse (ns) | Gain Ratio | Ref (ns) | Sparse (ns) | Gain Ratio |
| Integrated Design 1 | 1311 | 181 | 7.24 | 1296 | 90 | 14.40 | 1296 | 90 | 14.40 |
| Integrated Design 2 | 477 | 380 | 1.26 | 306 | 190 | 1.61 | 306 | 190 | 1.61 |
| Integrated Design 3 | 478 | 340 | 1.41 | 235 | 170 | 1.38 | 378 | 170 | 2.22 |
| Integrated Design 4 | 344 | 260 | 1.32 | 449 | 130 | 3.45 | 306 | 130 | 2.35 |
| Geometric mean | | | 2.03 | | | 3.24 | | | 3.32 |

FIG. 8

MEMORY PROFILER FOR EMULATION

TECHNICAL FIELD

The present disclosure generally relates to memory emulation, and more particularly to memory profiler for emulation.

BACKGROUND

Field programmable gate array (FPGA) based accelerated simulators have demonstrated high time efficiency and accuracy, far beyond the scope of typical software-based alternatives. FPGAs are composed of millions of lookup tables, each of them programmable to fulfill certain logic functions. Because of its hardware nature, FPGAs are desirable for parallel tasks and concurrent execution. Therefore, recent research has turned to FPGA accelerated simulators.

SUMMARY

In one or more embodiments, a method for determining a sparse memory size during emulation, the method includes determining, by a profiler memory coupled to a user memory, that one or more pages of the user memory are used by a first test sequence of a testbench during the emulation; identifying, by the profiler memory, a first set of indexes of the one or more pages of the user memory used by the first test sequence; determining a number of unique pages of the user memory that are used by the first test sequence for the emulation based on the first set of indexes; and determining, by a processor, the sparse memory size for the user memory based on the number of unique pages of the user memory that are used by the testbench for the emulation and a page size of the user memory.

In one or more embodiments, the method further includes storing, by the profiler memory, the first set of indexes in a storage device; determining, by the profiler memory, that one or more pages of the user memory are used by a second test sequence of the testbench for the emulation; identifying, by the profiler memory, a second set of indexes of the one or more pages of the user memory used by the second test sequence; and determining a maximum number of unique pages of the user memory that are used by the first and second test sequences for the emulation, where the determining the size of the sparse memory for the user memory is based on the maximum number of unique pages of the user memory that are used by the first and second test sequences of the testbench for the emulation and the page size of the user memory.

In one or more embodiments, the profiler memory has a same number of ports as the user memory and the ports in the profiler memory have one to one correspondence to the ports of the user memory.

In one or more embodiments, all ports in the profiler memory are write-only ports, wherein a data port of the profiler memory is connected to a voltage, and wherein an enable port of the profiler memory ports is connected to an enable port of the user memory ports.

In one or more embodiments, the user memory is divided into a plurality of pages, wherein a page of the plurality of pages of the user memory comprises a fixed-length contiguous block of memory of size in.

In one or more embodiments, each address of a plurality of addresses in the profiler memory corresponds to the page of the plurality of pages in the user memory.

In one or more embodiments, the method further includes based on determining that the one or more pages of the user memory are used by the first test sequence for the emulation, setting, by the profiler memory, data bits of one or more addresses in the profiler memory that correspond to the one or more pages of the user memory to 1.

In one or more embodiments, a depth of the profiler memory is a same as the number of unique pages in the user memory and a width of the profiler memory is one bit.

In one or more embodiments, the profiler memory determines that the pages of the user memory are used by the first test sequence during the emulation by determining a high state of an enable port of the user memory that is connected to an enable port of the profiler memory.

In one or more embodiments, the profiler memory determines the number of unique pages of the user memory that are used by the first test sequence for the emulation based on the first set of indexes stored in a storage device.

In one or more embodiments, an emulation system includes a processor; a field programmable gate array (FPGA); a user memory comprising a plurality of ports and connected to the FPGA; and a profiler memory comprising a plurality of ports and coupled to the user memory, an address port from among the plurality of ports of the profiler memory being connected to an address port of the plurality of ports of the user memory, wherein the profiler memory is configured to track most significant bits (MSB) of one or more addresses of the user memory accessed by the FPGA in response to a first test sequence of a testbench during an emulation; and determine page indexes of one or more pages of the user memory associated with the one or more addresses of the user memory accessed by the FPGA in response to the first test sequence. In one or more embodiments, the processor is configured to determine a sparse memory size for the user memory based on the page indexes of the one or more pages of the user memory associated with the one or more addresses of the user memory accessed by the FPGA in response to one or more test sequences of the testbench.

In one or more embodiments, the profiler memory is further configured to track most significant bits (MSB) of one or more addresses of the user memory accessed by the FPGA in response to a second test sequence of the testbench for the emulation; and determine page indexes of one or more pages of the user memory associated with the one or more addresses of the user memory accessed by the FPGA in response to the second test sequence.

In one or more embodiments, the processor is further configured to determine a maximum number of unique pages of the user memory that are accessed by the FPGA in response to the first and second test sequences for the emulation based on a first set of indexes of the one or more pages of the user memory used by the first test sequence, wherein the sparse memory size for the user memory is determined based on the maximum number of unique pages of the user memory that are accessed by the FPGA in response to the first and second test sequences of the testbench for the emulation and a page size of the user memory.

In one or more embodiments, each of the plurality of ports of the profiler memory corresponds to a port of the plurality of ports of the user memory, and wherein the profiler memory has a same number of ports as the user memory.

In one or more embodiments, the plurality of ports in the profiler memory are write-only ports, wherein a data port of the plurality of ports of the profiler memory is connected to a voltage, and wherein an enable port of the plurality of ports of the profiler memory is connected to an enable port of the plurality of ports of the user memory.

In one or more embodiments, the processor is further configured to determine a maximum number of unique pages of the user memory that are accessed by the FPGA in response to the first test sequence for the emulation based on the determined page indexes; and determine the sparse memory size for the user memory based on the maximum number of unique pages of the user memory that are accessed by the FPGA in response to the testbench for the emulation and a page size of the user memory.

In one or more embodiments, the profiler memory determines that the one or more pages of the user memory are accessed by the FPGA in response to the first test sequence during the emulation by determining a high state of an enable port from among the plurality of ports of the user memory that is connected to an enable port of the plurality of ports of the profiler memory.

In one or more embodiments, the user memory is divided into a plurality of pages, wherein a page of the plurality of pages of the user memory comprises a fixed-length contiguous block of memory of size $2^n$.

In one or more embodiments, each address of a plurality of addresses in the profiler memory corresponds to the page of a plurality of pages in the user memory.

In one or more embodiments, a non-transitory computer readable medium comprising stored instructions, which when executed by a processor, cause the processor to instantiate a profiler memory having a plurality of ports connected to corresponding ports of a user memory. In one or more embodiments, the profiler memory is configured to determine that one or more pages of the user memory are accessed by a first test sequence of a testbench for an emulation; track most significant bits (MSB) of one or more addresses of the user memory used in the first test sequence of the testbench for the emulation; determine page indexes of the one or more pages of the user memory associated with the one or more addresses of the user memory used in the first test sequence; identify a first set of indexes of the one or more pages of the user memory used by the first test sequence; store the first set of indexes in a storage device; determine a number of unique pages of the user memory that are used by the first test sequence for the emulation; and determine a size of a sparse memory for the user memory based on the number of unique pages of the user memory that are used by the testbench for the emulation and a page size of the user memory.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 6 illustrates a table including the number of unique pages of the user memory that are being used by all the test sequences for an emulation cycle for different page sizes.

FIG. 8 illustrates a table ("Table 2") illustrating gain in processing speed for different systems when sparse memory is used during emulation.

DETAILED DESCRIPTION

Figure 1:
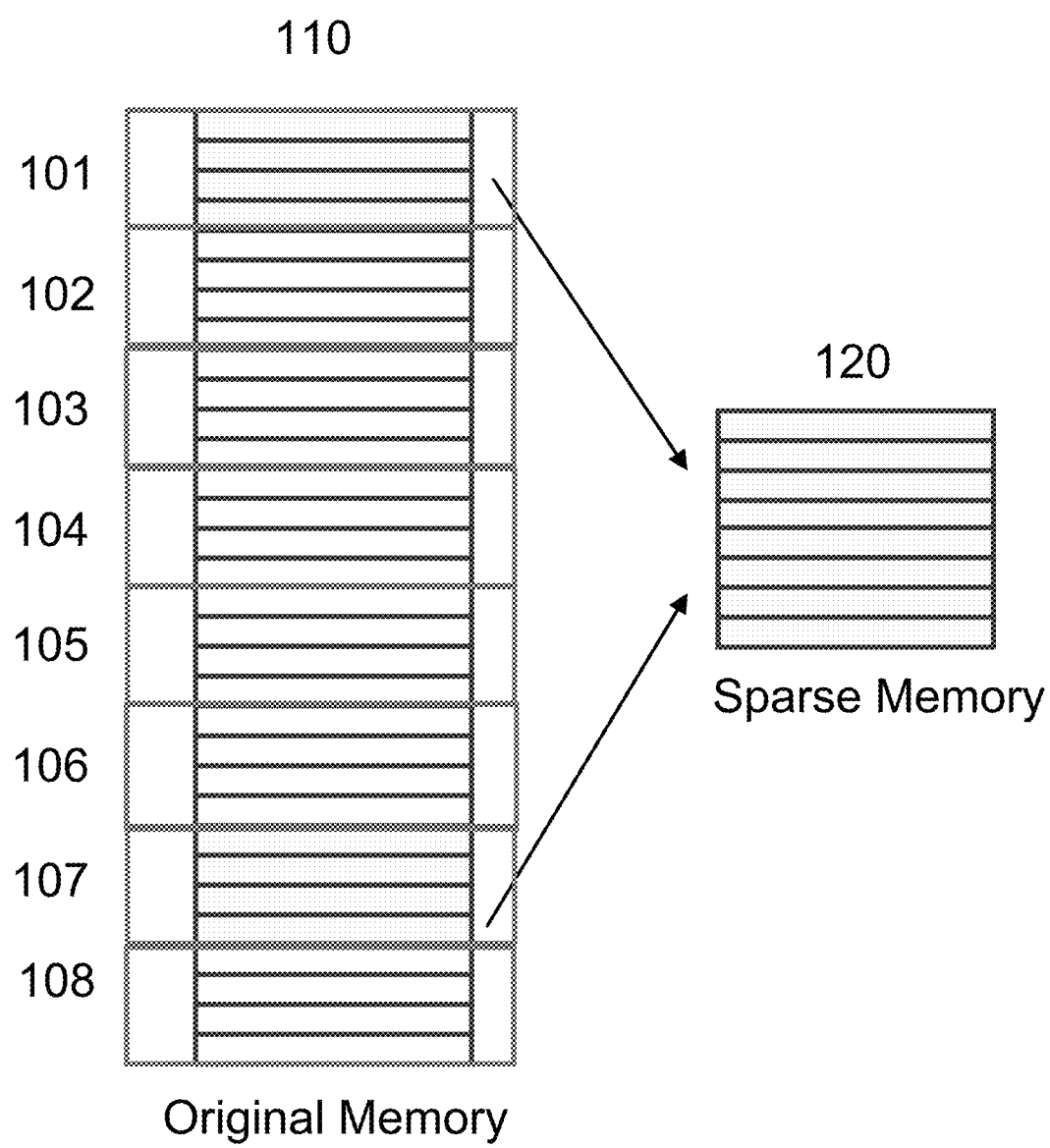
FIG. 1 illustrates a sparse memory optimization by an emulation compiler during an emulation or a verification process, according to one embodiment.

Aspects of the present disclosure relate to a system and method for providing a memory profiler for emulation.

Many computer systems and embedded devices include processors and memories, where the processors are configured to store program instructions and data in the memories during regular operation. Evaluating many alternative approaches in processor and memory design have become essential for system design.

Hardware based emulators are becoming important in the verification step of chip design or integrated circuit design. Hardware emulators are an order of magnitude faster than software-based verification (e.g., software simulation). Emulation speed is important to further reduce verification time. Memories within the hardware emulators play an important role in deciding the emulation speed and throughput.

Field programmable gate array (FPGA) based accelerated emulators have demonstrated high time efficiency and accuracy, far beyond the scope of other software-based simulator alternatives. FPGAs are composed of millions of lookup tables, each of them programmable to fulfill certain logic functions. Because of their hardware nature, FPGAs are desirable for parallel tasks and concurrent execution.

FPGA based emulators have multiple memory primitives like double data rate synchronous dynamic random access memory (DDR SDRAM), block random access memory (BRAM), ultra RAM (URAM), and look-up table RAM (LUTRAM) which are on-chip. These emulator platforms also have on-board memories like DDR's. Each of these memory types has distinguishing features. For example, BRAM has small latency, multiple ports, medium-size capacity and spread across many physical locations within a FPGA. DDR SDRAM memories on other hand have larger latency, bigger capacity, and limited physical location. DDR SDRAM is the largest capacity memory, but it also has the highest latency which can adversely impact emulation speed.

An emulation compiler maps user memories (e.g., memory addresses accessed by a test suite executed by an emulated integrated circuit) on to physical memories considering memory primitives availability and their performance limits. The emulation compiler may decompose a large user memory into manageable blocks which can then be efficiently mapped onto available and/or performance friendly resources. In one or more embodiments, a user memory that can be written to and/or read from by the emulated integrated circuit and may be one or more of a random access memory (RAM), a static RAM (SRAM), a read only memory (ROM), or a programmable read only memory (PROM), an erasable programmable read only memory (EPROM), an electrically erasable programmable read only memory (EEPROM), Flash, or variations thereof, used for storing data and control bits during the logic operation.

User memories are transformed and/or reshaped and optimized, using either static or dynamic information. Static information like constant values present on wires and driver-load analysis help in performing efficient mapping to make best use of these resources. Dynamic information like access pattern of the user memory address space by user's test sequences can also be exploited to optimize usage of memory primitives.

During resistor-transistor logic (RTL) design, the memory is envisioned with largest possible addresses suitable for the end-user application scenario. However, during verification phase the test scenarios hardly exercise the entire memory. Verification scenarios are deliberately kept simple and targeted to improve verification productivity and ease-of-debug. The emulation compiler may not leverage this aspect and end up instantiating the entire RTL memory with entire set of addresses, such that the emulation compiler maps the user memory onto larger-capacity and slower performing memory primitives, such as DDR SDRAM, even though the verification scenarios may actually use a relatively small portion of the available capacity.

Memory abstractions like cache memory and sparse memory are techniques that when provided by the emulation compiler may be effective in improving throughput and reducing memory primitive resource consumption. A memory abstraction is an abstraction layer between the program execution and the memory that enables the communication between the program execution and the memory. Different memory abstraction techniques exploit a user's test sequences locality of reference and temporal coherence of contents to map a large memory address space to small physical memory. Usage of memory abstractions improves throughput as some types of physical memory (e.g., BRAM) may be smaller but may be an order of magnitude faster compared to a large physical memory (e.g., DDR SDRAM) to which user memory may have been mapped.

The performance of a computer system is affected by its least efficient (e.g., slowest) component. For example, one or more embodiments of the present disclosure may improve the emulation performance/emulation speed by having the emulated processor write to faster types of memory (e.g., BRAM) if possible, rather than slower DDR DRAM, as determined by an emulation compiler. The tracing of memory usage proposed by one or more embodiments of the present disclosure may determine how much memory is actually used by the processor in the course of running its tests, which then helps the emulation compiler in determining whether, for example, all of the data written/read by the processor during a test can actually fit into the BRAM.

One or more embodiments of the present disclosure provide a method and/or a system for measuring an actual memory usage during execution of test sequences to determine a suitable size of a sparse memory that is suitable for all the test sequences used during an emulation cycle of a user memory to improve the emulation speed and throughput for the future emulation cycles. For example, one or more embodiments of the present disclosure may substantially accurately identify the number of pages and a suitable size of each of the pages that will suffice for an entire suite of verification tests without having any impact on design functionality and performance.

One or more embodiments of the present disclosure tracks access patterns of a large user memory during emulation using a memory profiler or a profiler memory. One or more embodiments of the present disclosure performs this tracking with small overhead and without impacting the design functionality and/or performance of the user memory. Information captured from the tracking of large memory during emulation can be used as parameters for memory optimization techniques for performance and space during future emulation cycles.

Technical advantages of the present disclosure include, but are not limited to measuring an actual memory usage during execution of test sequences to determine a suitable size of a sparse memory that is suitable for all the test sequences used during an emulation cycle of a user memory to improve the emulation speed and throughput for the future emulation cycles by using a profiler memory. Without the profiler memory, sparse memory optimization may be difficult to implement in emulation as it would require extensive knowledge of test sequence for all relevant memories. Therefore, one or more embodiments of the present disclosure improve throughput and reduce memory primitive resource consumption during emulation. In one or more embodiments, the memory profiler data can be generated by a user who may not have expertise in the field of memory optimization. In one or more embodiments of the present disclosure, the memory profiler may be used in an emulation system without changing any design functionality of the system and without negatively impacting the performance of the emulation and compilation time and may require little to no additional resource.

In sparse memory optimization technique, an internal mapping is maintained by the emulation compiler or the emulator to translate user memory address to physical memory address. For example, FIG. 1 illustrates a sparse memory optimization by an emulation compiler during an emulation or a verification process. In FIG. 1, a memory 110 that is 5 bit wide and has 32 memory addresses is illustrated as one example. However, the present disclosure is not limited thereto, and the memory 110 may include a very large number of addresses. The memory 110 is divided into eight pages 101, 102, 103, 104, 105, 106, 107, 108, each page including four (5 bit) addresses. As shown in FIG. 1, during the verification process, a testbench (or a test sequence) may only use the addresses in pages 101 and 107 of the memory 110. In one or more embodiments, during emulation, the emulation compiler translates (or maps) the user memory address (e.g., the addresses in pages 101 and 107 of the memory 110) to physical memory address and creates the sparse memory 120.

For example, when creating the sparse memory 120, if the addresses that are accessed (e.g., the addresses in pages 101 and 107 of the memory 110 of FIG. 1) have spatial locality, the sparse memory abstraction discussed above with respect to FIG. 1 may be done at the granularity of a page rather than an address.

Figure 2:
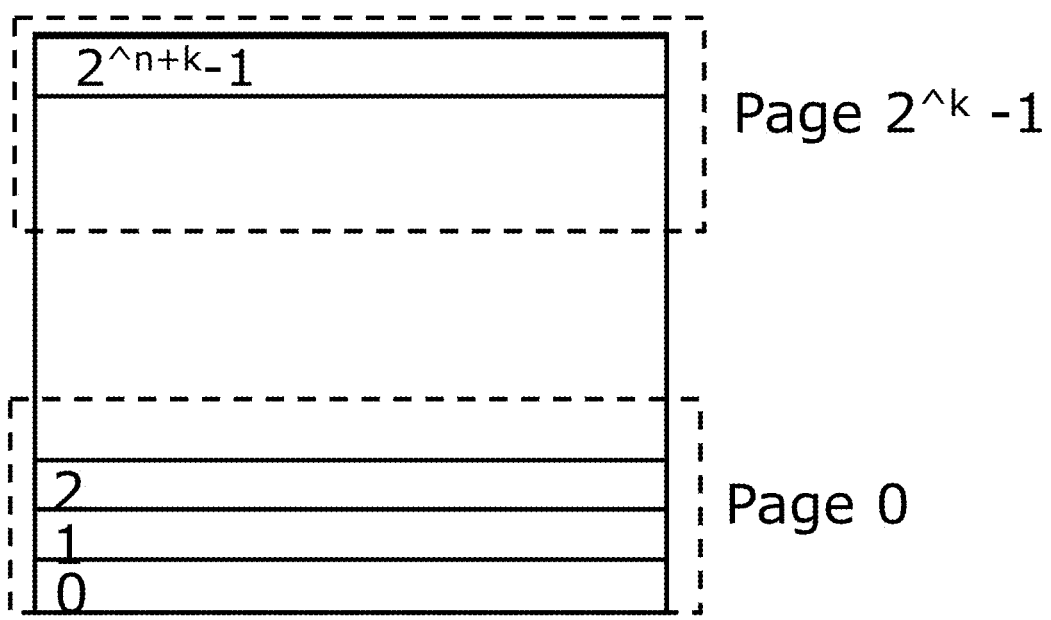
FIG. 2 illustrates a memory that is composed of contiguous pages, according to one embodiment.

FIG. 2 illustrates a memory that is composed of contiguous pages. As shown in FIG. 2, the memory 200 includes $2^k$ pages, where k is a positive integer. For example, the memory 200 may include page 0 to page ($2^k-1$), where each of the pages from among the page 0 to page ($2_k-1$) includes multiple memory addresses. In one or more embodiments, in the memory 200 of FIG. 2, each page may include equal numbers of memory addresses. For example, a page from among the page 0 to page ($2^k-1$) of the memory 200 may be defined as a fixed-length contiguous block of memory of size $2^n$, where n is an integer (e.g., a positive integer). In one or more embodiments, the user memory (e.g., memory 110 of FIG. 1) and the physical memory (e.g., sparse memory 120 of FIG. 1) may be composed of contiguous pages.

Figure 3:
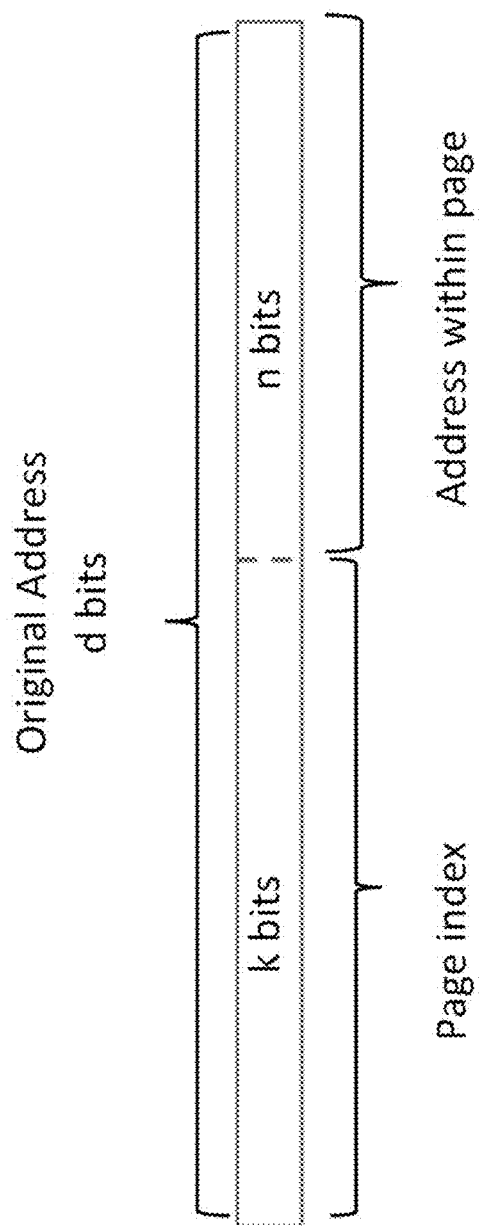
FIG. 3 illustrates a memory address, according to one embodiment.

In one or more embodiments, a memory address may be assumed to be made of two parts, for example, in a memory address, the most significant bits (MSB) of the address may represent a page index and the least significant bits (LSB) of the address may represent the address within that page. FIG. 3 illustrates a memory address, according to one embodiment. If a memory address from among the page 0 to page ($2^k-1$) of the memory 200 (e.g., a memory address with a page from among the page 0 to page ($2^k-1$) of the memory 200) is assumed to contain d number of bits, the k number of MSB from among the d number of bits may represent the page index of the page that includes the address, and the n number of LSB from among the d number of bits may represent the address within that page where d=k+n.

Based on the above, in one or more embodiments, during emulation, the dynamic mapping between the user memory page index to the physical memory page index to translate or map the user memory address (e.g., the addresses in pages 101 and 107 of the memory 110) to a physical memory address may be performed based on the information provided by the emulation compiler.

Key of the above mentioned mapping is MSB of the user memory and data is MSB of the physical memory. For example, in one or more embodiments, the emulation compiler or the emulator maintains a page table. In the emulator page table, a key may include a MSB of the user memory address and a corresponding data may be a MSB of the physical memory address. In other words, given a test sequence that tries to access some memory location based on a user memory address, the emulator can take some number of MSB of the user memory address and use that to translate or map those MSB onto a physical memory address. In other words, the mapping may be from a page in a user memory address space to a corresponding page in a physical address space (e.g., the LSBs may represent the addresses within those pages). Therefore, even if the user memory addresses that are accessed over the course of a emulation are very spread out (e.g., with very different MSBs), once the tracing is completed, the emulation compiler determines the user memory addresses across a wide range of pages that were actually used and whether the number of pages can all fit into a very small number of pages that are close together and located in a faster memory, such as on-chip block memory, which leads to a performance improvement.

For example, in one or more embodiments, during emulation, memory access pattern changes with each test sequence and therefore this mapping is dynamic in nature and created and/or updated during emulation itself. For example, the sparse memory 120 may include the same number of addresses as in the pages 101 and 107 of the memory 110 that are actually used while running the testbench or test sequence during the verification process. While the mapping is dynamic in nature, the memory instantiated (e.g., the sparse memory 120) during design compilation stage is a fixed size memory.

For example, a challenge in adopting the sparse memory optimization in emulation is in estimating the size and/or parameters of these high-level memory abstractions conducive for all test sequences during verification. In other words, sparse memory abstraction requires the user to suggest a size of the sparse memory which is suitable (e.g., suitably large) for all the test sequences used during the emulation. The emulation compiler must be provided with this parameter which can satisfy all the test sequences memory requirements. However, it may be challenging for a user to compute or guess a suitable size of the sparse memory suitable for all the test sequences used during the emulation beforehand. Also, with designs having large number of memories of varying sizes coupled with large number of verification scenarios to be covered, it may become an overwhelming task for a user to predict the number of pages used by each memory instance across all test runs.

Using an initial heuristic value for the number of pages consumed by an entire suite of tests and then iteratively increasing the estimates based on failed test-runs of the entire suite may result in manual drudgery and waste of verification resources (e.g., due to emulation time wasted on test runs that fail due to insufficient memory).

One or more embodiments of the present disclosure provide a method and/or system to measure actual memory usage during execution of test sequences to determine a suitable size of the sparse memory that is suitable for all the test sequences used during an emulation cycle of a user memory to improve the emulation speed and throughput for the subsequent emulation cycles by allowing the emulation compiler to use faster, but smaller, memories within the emulation platform. The method includes: 1) tracking pages used by a user memory for each test sequence during an emulation cycle using a profiler memory, and then writing the data from the tracking to a disk at the end of each test sequence emulation; and 2) processing the data from step (1) to generate sparse memory options for subsequent emulation runs of the test sequences.

For example, once the data corresponding to all the pages used by the user memory for all the test sequences during emulation is obtained (e.g., the actual memory usage during execution of test sequences is determined), a suitable size of the sparse memory suitable for all the test sequences used during the emulation may be determined and based on such data a sparse memory may be created, which in turn may increase the emulation speed and throughput for the subsequent emulations.

Figure 4A:
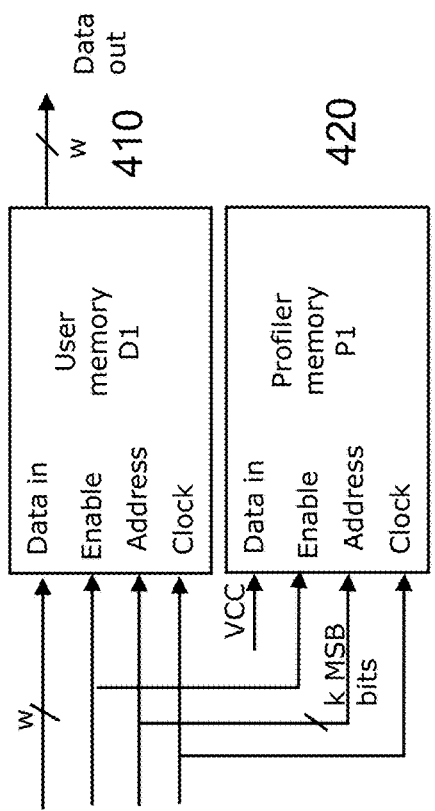
FIGS. 4A-4B illustrate a system to track pages used by a user memory for each test sequence of all the test sequences used during an emulation cycle using a profiler memory, according to one embodiment.
Figure 4B:
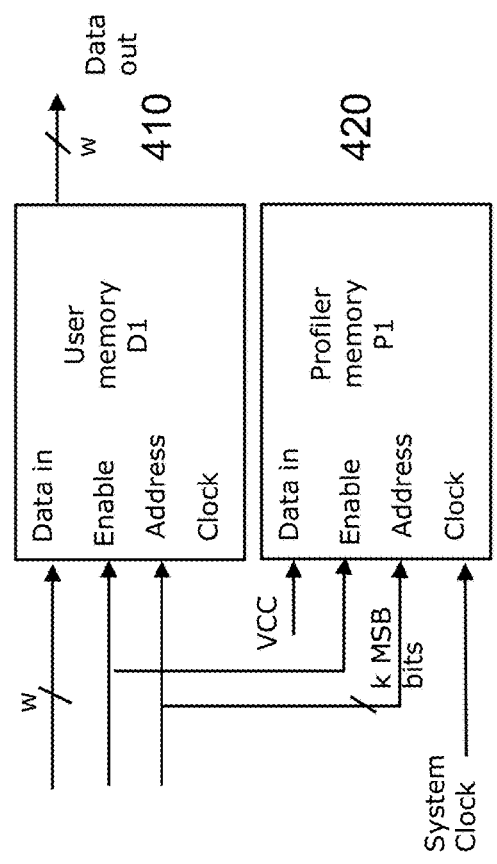

FIGS. 4A-4B illustrate a system to track pages used by a user memory for each test sequence of all the test sequences used during an emulation cycle using a profiler memory.

As shown in FIGS. 4A-4B, to track pages used by a user memory 410, a profiler memory 420 may be connected to the user memory 410. The profiler memory 420 may have one write port for each port of the user memory 410.

In one or more embodiments, FIG. 4A shows connections for a synchronous (sync) port from the user memory 410 to the profiler memory 420, where the enable pin, the address pin, and the clock pin of the user memory 410 are connected to the enable pin, the address pin, and the clock pin of the profiler memory 420, respectively. The data input pins of the user memory 410 and the profiler memory 420 are not connected and the data input pin of the profiler memory 420 is set at VCC (e.g., a high-level voltage) or the data input pin of the profiler memory 420 is set to a constant value representing logic "1". FIG. 4B shows connections for an asynchronous (async) port from the user memory 410 to the profiler memory 420, where the enable pin and the address pin of the user memory 410 are connected to the enable pin and the address pin of the profiler memory 420, respectively. In asynchronous port connections, the clock pin of the profiler memory 420 may be connected to the system clock (e.g., the computer system that houses the user memory 410). In FIG. 4B, the data input pins of the user memory 410 and the profiler memory 420 are not connected and the data input pin of the profiler memory 420 is set at VCC (e.g., a high-level voltage). Therefore, in one or more embodiments, the profiler memory 420 may have one write port for each port of user memory 410. In one or more embodiments, the width of the profiler memory 420 may be 1 bit and the depth of the profiler memory may be the same as the number of pages in the corresponding user memory 410.

In one or more embodiments, the profiler memory 420 may have the same number of ports as the user memory 410 and the ports in the profiler memory 420 may have one to one correspondence to the user memory ports. Also, in the profiler memory 420, all ports are write-only ports.

In one or more embodiments, each address in the profiler memory 420 corresponds to each of the pages in the user memory 410. For example, if there are $2^k$ number of pages in the user memory 410, the profiler memory 410 may have $2^k$ number of addresses, each address in the profiler memory corresponding to each of the pages from among the $2^k$ number of pages in the user memory 410. For example, if a page size in a user memory (e.g., the user memory 410) is defined as $2^{10}$ (e.g., n=10), and if it is assumed that an 8 GB memory of depth=$2^{27}$ and width=$2^5$ is used as the user memory (e.g., the user memory 410), a corresponding profiler memory (e.g., the profiler memory 420) may have a depth=$(2^{27}/2^{10})=2^{(27-10)}=2^{17}$; and may have a width=1. Therefore, the profiler memory (e.g., the profiler memory 420) to track the usage of 8 GB of user memory may have a size of 16 KB.

In one or more embodiments, to measure actual memory usage during execution of test sequences to determine a suitable size of the sparse memory that is suitable for all the test sequences used during an emulation cycle, a profiler memory (e.g., the profiler memory 420) may be instantiated for each user memory (e.g., the user memory 410). Therefore, in one or more embodiments, during an emulation cycle, if multiple user memories are used, each of the user memory may have a corresponding profiler memory.

Figure 5:
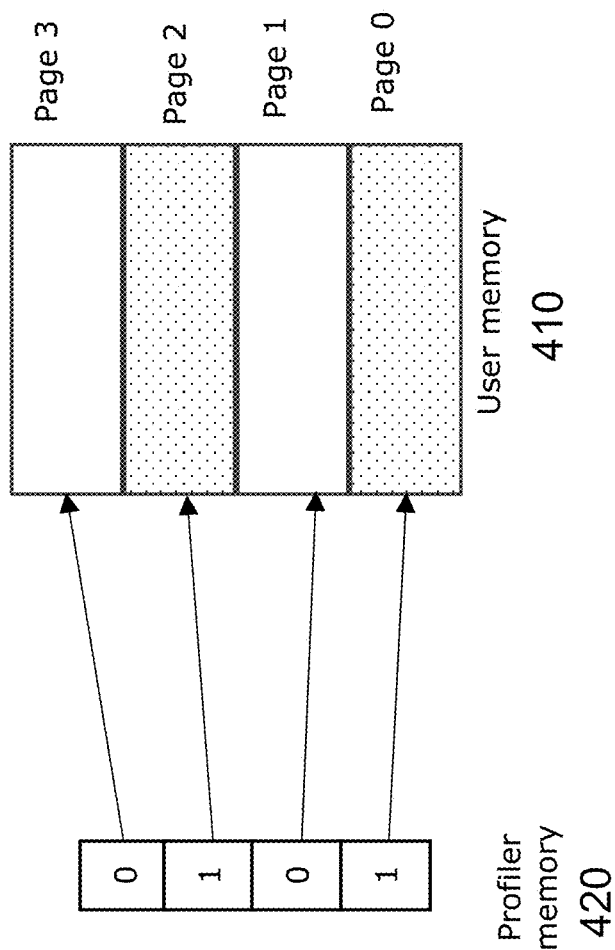
FIG. 5 illustrates a mapping between a user memory and a profiler memory, according to one embodiment.

FIG. 5 illustrates a mapping between a user memory and a profiler memory, according to one embodiment. A page size in a user memory 410 is defined. As discussed above, a page in a memory may be defined as a fixed-length contiguous block of memory of size $2^n$, where n is an integer (e.g., a positive integer). A profiler memory 420 takes the d-n most significant bits of a user memory address (e.g., sometimes denoted herein as the k most significant bits or MSBs) and stores a 1 when any user memory address starting with those k MSBs is accessed. As such, as the page size n increases, the number of entries (d-n) in the profiler memory decreases. However, as the page size n increases, the granularity of tracing information about memory usage decreases (e.g., the profiler memory 420 stores information with less precision about where the data is written). In one or more embodiments, an optimal value (e.g., a desirable value) for n may be 9, 10, or 11, for a most efficient use of the profiler memory space during emulation.

In one or more embodiments, the profiler memory 420 determines that the pages of the user memory 410 have been used by a test sequence of all the test sequences used during an emulation cycle by tracking the high state of the enable pin of the user memory 410 as the enable pins of the user memory 410 and the profiler memory 420 are connected. When the profiler memory 420 determines that the test sequence is using a page of the user memory 410, the profiler memory 420 may identify the page and determine the page index (e.g., the k MSBs of the user memory address) as the address pins of the of the user memory 410 and the profiler memory 420 are connected. Next, the profiler memory 420 may set the data bit of the address in the profiler memory 420 that corresponds to that page to 1 (and therefore the index of the page is stored in the profiler memory 420).

For example, as shown in FIG. 5, during an emulation cycle, if only page 0 and page 2 of the user memory 410 are being used, the profiler memory 420 may set the data bit to 1 of the addresses in the profiler memory 410 that correspond to page 0 and page 2 of the user memory 410. Therefore, when one or more pages of the user memory 410 that are used for a test sequence are identified, the corresponding indexes (e.g., MSB bits of the address) of the pages are stored in the profiler memory 420. For example, at the end of an emulation cycle, one file (e.g., one unique file) is dumped (e.g., saved in a storage disk) for each test sequence for each user memory. The file for each test sequence for each user memory may include the indexes of the pages of the user memory that were used by the test sequence. For example, if only page 0 and page 2 of the user memory 410 were used in a test sequence, at the end of the emulation cycle, the file corresponding to the test sequence may include the indexes of page 0 and page 2 and that file may be saved in a storage disk (e.g., a hard drive disk (HDD), FPGAs etc.).

Next, the present system measures an actual memory usage during execution of test sequences to determine a desired size of the sparse memory. For example, to determine the size of the sparse memory, the maximum number of the unique pages of the user memory (e.g., the user memory 410) that have been used by all the test sequences for the emulation cycle is determined by reading the page indexes in the files saved after the emulation cycle (e.g., the files contain the indexes of the pages that have been used by each of the test sequences during the emulation cycle). A desired size of the sparse memory for all the test sequences is determined by multiplying the maximum number of the unique pages of the user memory (e.g., the user memory 410) that have been used by all the test sequences for the emulation cycle with the size of each page (e.g., $2^n$) in the user memory (e.g., the user memory 410).

For example, if the user memory includes Q number of pages and if the maximum number of unique pages of the user memory that are being used by all the test sequences for the emulation cycle is P (where P and Q are integers and P<Q), and if the page size in the user memory is defined as $2^n$ (where n is an integer), the size of the sparse memory may be $P*2^n$, which is smaller than the size of the user memory (e.g., the size of the user memory may be $Q*2^n$, where Q>P).

The size of the pages tracked by the profiler memory 420 may be the same as the page size of the user memory. For example, FIG. 6 illustrates a table ("Table 1") including the number of unique pages of the user memory that are being used by all the test sequences for an emulation cycle for different page sizes as tracked by the profiler memory 420. For sparse memory, data manipulation (e.g., a process of adjusting data (e.g., inserting, deleting, and/or modifying data in one or more pages) to make it organized and easier to read) can be done to compute constraint for larger page size.

For example, in one or more embodiments, as shown in FIG. 6, in one case, a page in the user memory 410 is defined as a fixed-length contiguous block of memory of size $2^{10}$. In such a case, for an emulation cycle, test sequence 1 uses four unique pages (page 0, page 4, page 5, and page 6) of the user memory 410 and test sequence 2 uses five unique pages (page 1, page 8, page 9, page 12, and page 13) of the user memory 410. Therefore, the maximum number of the unique pages of the user memory that are being used by the test sequence 1 and test sequence 2 for the emulation cycle is five. Therefore, in this case, the size of the sparse memory will be $5*2^{10}=5120$.

For example, in one or more embodiments, as shown in FIG. 6, in another case, a page in the user memory 410 is defined as a fixed-length contiguous block of memory of size $2^{11}$, and the profiler memory 420 uses one fewer bit than in the case where the pages have a size of $2^{10}$, thereby halving the size of the profiler memory 420 compared to the case where the pages have a size of $2^{10}$. In such a case, for an emulation cycle, test sequence 1 uses three unique pages (page 0, page 2, and page 3 (page 2 has been used twice by the test sequence 1)) of the user memory 410 and test sequence 2 uses three unique pages (page 0, page 4, and page 6 (page 4 and page 6 have been used twice by the test sequence 2)) of the user memory 410. Therefore, the maximum number of the unique pages of the user memory that are being used by the test sequence 1 and test sequence 2 for the emulation cycle is three. Therefore, in this case the size of the sparse memory will be $3*2^{11}=6144$. In the examples shown in FIG. 6, choosing a smaller page size of $2^{10}$ gave a measured memory usage of 5120, while choosing a larger page size of $2^{11}$ gave a measured memory usage of 6144 for the same test sequences, with a tradeoff of being able to instantiate a smaller profiler memory 420 when the page sizes are smaller. As such, the choice of page size represents a tradeoff between profiler memory size and granularity of the tracing, and hence the precision with which the memory usage during the test sequences can be measured.

The page size in the user memory 410 may be defined by the user. For example, the user may define the value of n (e.g., as the page size in the user memory is defined as a fixed-length contiguous block of memory of size $2^n$, where n is an integer) based on their preference. However, an optimal value (e.g., a desirable value) of n=9, 10, or 11, may be desirable for efficient use of user memory space, for a suitable size of sparse memory, and for improving the emulation speed and throughput. In one or more embodiments, a page size for constraint generation may be equal to $(2^n*2^t)$, where $2^n$ is a default page size. In one or more embodiments, new page-indexes used by each test sequence may be determined by dividing the page-index by $2^t$. For example, when page size is changed from $2^{n1}$ to $2^{n2}$, new page-indexes used by each test sequence may be determined by dividing the page-index by $2^t$, where $2^t=(2^1$ to $2^2)$, or in other words, t=(n1-n2).

In one or more embodiments, if the size of the user memory page is changed (for example, as shown in FIG. 6, the page size is changed from $2^{10}$ to $2^{11}$), the new page indexes used by each test sequence may be determined by dividing the page-index by $2^t$. For example, the indexes may be changed by dividing by the quotient of the page sizes. Here, going from $2^{10}$ to $2^{11}$, the quotient is $2^1$, so by dividing the page indices from the $2^{10}$ table by $2^1$, the page indices for the $2^{11}$ table may be determined.

The method to measure actual memory usage during execution of test sequences to determine a suitable size of the sparse memory described above is accomplished using a profiler memory (e.g., profiler memory 420). Without the profiler memory (e.g., profiler memory 420), sparse memory optimization may be difficult to implement in emulation as it would require extensive knowledge of the behavior of each test sequence for all relevant memories. Therefore, one or more embodiments of the present disclosure provides a method and a system that may be used by an emulation compiler to determine a suitable size of the sparse memory that is suitable for all the test sequences used during an emulation cycle of a user memory to improve throughput and reduce memory primitive resource consumption during subsequent emulation cycles. In one or more embodiments, the memory profiler (e.g., the memory profiler 420) data can be generated by a user who may not have an expertise in the field of memory optimization. The memory profiler (e.g., the memory profiler 420) may be used in an emulation system without changing any design functionality of the system and without negatively impacting the performance of the emulation and compilation time and may require little to no additional resource. Further, in one or more embodiments, multiple sparse memory settings may be generated with only one emulation of all test sequences.

Figure 7:
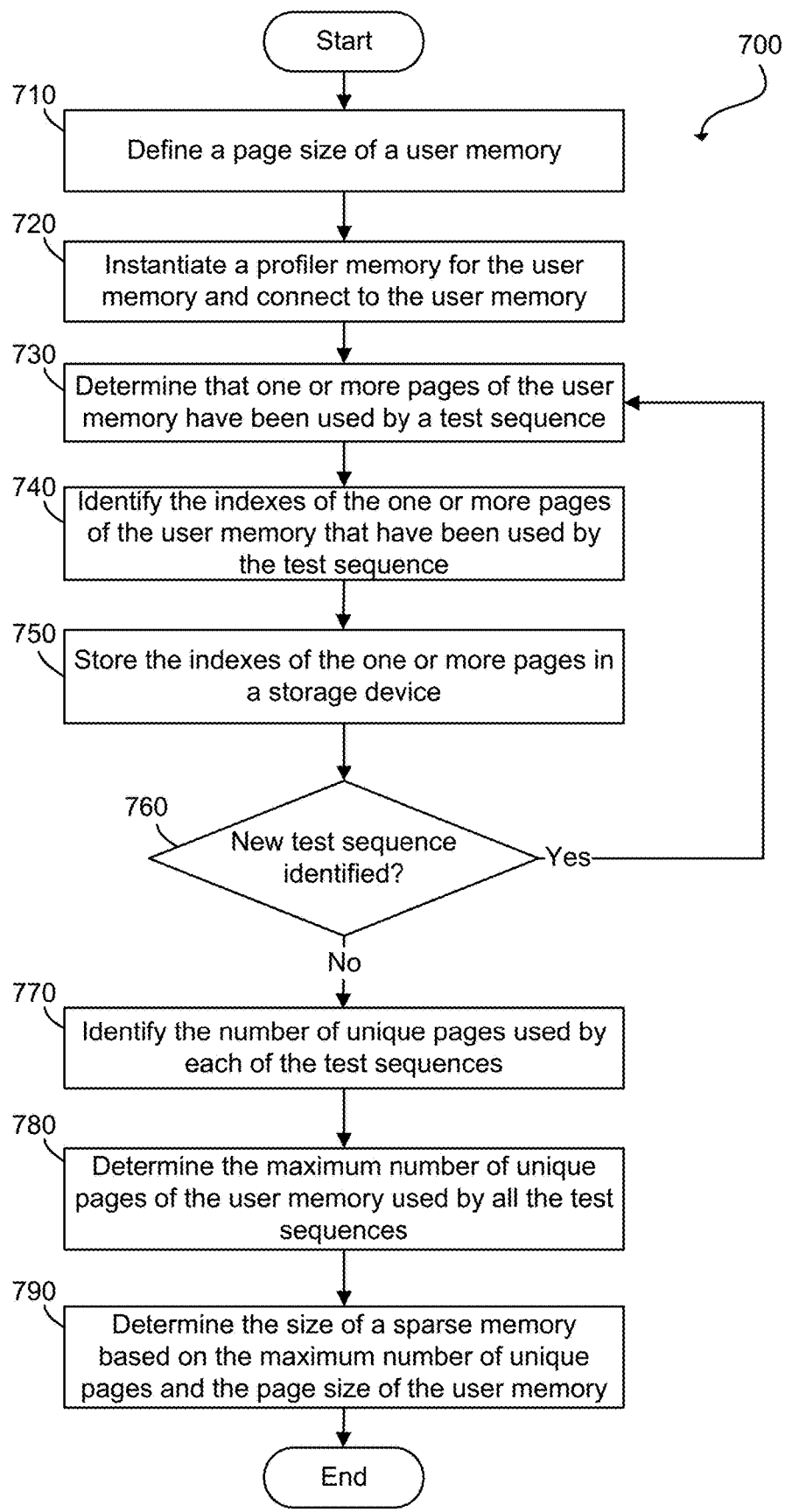
FIG. 7 illustrates a flowchart describing a method to determine an optimal size of a sparse memory that is suitable for all the test sequences used during an emulation cycle of a user memory.

FIG. 7 illustrates a flowchart describing a method to measure actual memory usage during execution of test sequences to determine a suitable size of a sparse memory that is suitable for all the test sequences used during an emulation cycle of a user memory. The method 700 of FIG. 7 may be implemented by the system 1000 of FIG. 10 or the system of FIGS. 4A-4B.

In the method 700 of FIG. 7, at 710, a page size of a user memory to be emulated is defined. For example, a page size in the user memory (e.g., the user memory 410 or the Design Under Test ('DUT') 1005) may be defined (e.g., by a user). A page in a memory may be defined as a fixed-length contiguous block of memory of size $2^n$, where n is integer. In one or more embodiments, an optimal value (a desirable value) for n may be 9, 10, or 11, for most efficient use of the user memory space during emulation. The width of a page in the user memory may be the same as the width of the user memory.

Next, at 720, a profiler memory may be instantiated for the user memory and may be connected to the user memory. For example, a profiler memory 420 may be instantiated for the user memory 410 and the profiler memory 420 may be coupled to the user memory 410.

Next at 730, the profiler memory determines that one or more pages of the user memory have been used by a test sequence for emulation. For example, the profiler memory 420 may determine that the pages of the user memory 410 have been used by a test sequence (of all the test sequences) used during an emulation cycle by tracking the high state of the enable pin of the user memory 410 as the enable pins of the of the user memory 410 and the profiler memory 420 are connected.

Next at 740, the profiler memory identifies the indexes of the one or more pages of the user memory that have been used by the test sequence for emulation. For example, when the profiler memory determines that the test sequence is using a page of the user memory 410, the profiler memory 420 may identify the page and determine the page index as the address pins (the k MSB bits of the address pins) of the of the user memory 410 and the profiler memory 420 are connected. Next, due to connection to the user memory 410, data bit of the address (or the k MSB bits of the address) in profiler memory 420 that corresponds to that page is set as 1 (and therefore the index of the page is stored in the profiler memory 420).

Next, at 750, the indexes of the one or more pages of the user memory that have been used by a test sequence (of all the test sequences) used during the emulation cycle are stored in a file of a storage device by the profiler memory or an emulation compiler. For example, at end of an emulation cycle, one file is dumped (e.g., saved in a storage disk) for each test sequence for each user memory. The file for each test sequence for each user memory may include the indexes of the pages of the user memory that are being used by the test sequence.

At 760, the profiler memory determines if there are any more test sequences for the current emulation cycle. If so, the profiler memory returns to 730 for a subsequent test sequence of the emulation cycle.

At 760, if the profiler memory determines that there are no more test sequences for the current emulation cycle, at 770, the profiler memory identifies the number of unique pages used by each of the test sequences in the emulation cycle.

Next at 780, the profiler memory determines the maximum number of unique pages of the user memory that have been used by all the test sequences for the emulation cycle. For example, the maximum number of the unique pages of the user memory (e.g., the user memory 410) that have been used by all the test sequences for the emulation cycle is determined by reading the page indexes in the files saved after the emulation cycle (e.g., the files contain the indexes of the pages that have been used by each of the test sequences of all the test sequences used during the emulation cycle).

Next at 790, the profiler memory determines the size of a sparse memory based on the maximum number of unique pages and the page size of the user memory. For example, a suitable size of the sparse memory for all the test sequences is determined by multiplying the maximum number of the unique pages of the user memory (e.g., the user memory 410) that have been used by all the test sequences for the emulation cycle with the size of each page (e.g., $2^n$) in the user memory (e.g., the user memory 410).

Using this newly determined maximum number of unique pages, subsequent emulation runs can be performed using a sparse memory that is sized based on the maximum number of unique pages determined at 790 (e.g., set to be equal to the maximum number of unique pages or set to the next power of two larger that is equal to or greater than the number of unique pages), thereby allowing a sparse memory to be configured that is sufficiently large to perform all of the test sequences in the testbench without resulting in out of memory errors and that can allow smaller, higher performance memories to be used for emulation (e.g., BRAM or SRAM).

FIG. 8, illustrates a table ("Table 2") illustrating gain in processing speed for different systems when sparse memory is used during emulation.

For example, when using an emulation platform 1, the gain in speed for an integrated system 1 when using a sparse memory may be 7.24, the gain in speed for an integrated system 2 when using a sparse memory may be 1.26, the gain in speed for an integrated system 3 when using a sparse memory may be 1.41, and the gain in speed for an integrated system 4 when using a sparse memory may be 1.32. Therefore, for emulation platform 1, the geometric mean of the speed gains for the integrated systems 1 to 4 when using a sparse memory may be 2.03.

For example, when using an emulation platform 2, the gain in speed for the integrated system 1 when using a sparse memory may be 14.40, the gain in speed for the integrated system 2 when using a sparse memory may be 1.61, the gain in speed for the integrated system 3 when using a sparse memory may be 1.38, and the gain in speed for the integrated system 4 when using a sparse memory may be 3.45. Therefore, for emulation platform 2, the geometric mean of the speed gains for the integrated systems 1 to 4 when using a sparse memory may be 3.24.

For example, in emulation platform 3, the gain in speed for integrated system 1 when using a sparse memory may be 14.40, the gain in speed for integrated system 2 when using a sparse memory may be 1.61, the gain in speed for integrated system 3 when using a sparse memory may be 2.22, and the gain in speed for integrated system 4 when using a sparse memory may be 2.35. Therefore, for emulation platform 3, the geometric mean of the speed gains for the integrated systems 1 to 4 when using a sparse memory may be 3.32.

Therefore, using a sparse memory during emulation may significantly improve emulation speed. As such, measuring an actual memory usage during execution of test sequences during an emulation cycle of a user memory to determine a suitable size of a sparse memory that is suitable for all the test sequences used during the emulation cycle using the one or more embodiments of the present disclosure may improve the emulation speed and throughput for the future emulation cycles.

Figure 9:
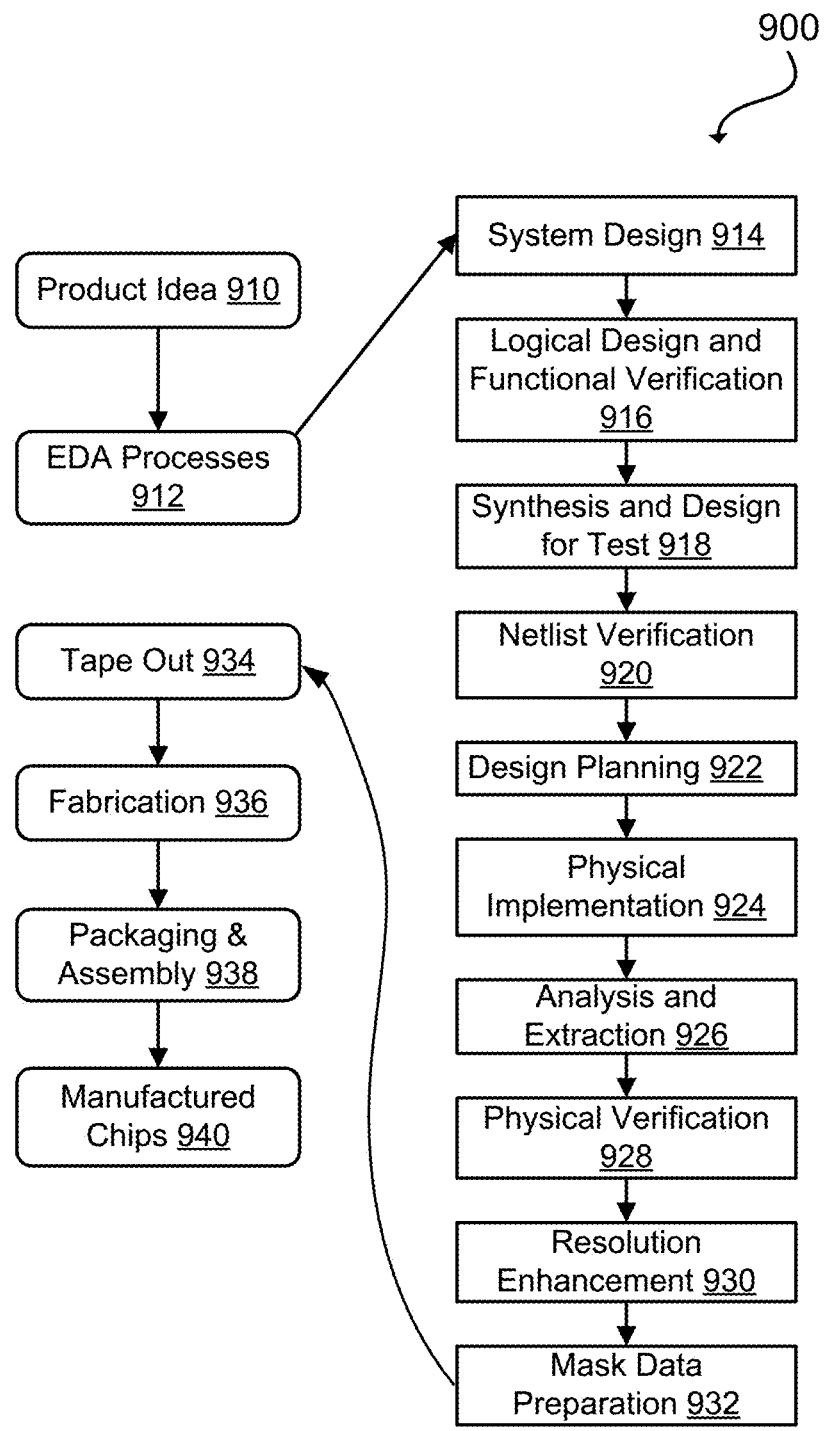
FIG. 9 depicts a flowchart of various processes used during the design and manufacture of an integrated circuit in accordance with some embodiments of the present disclosure.

FIG. 9 illustrates an example set of processes 900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information which is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 938 are performed to produce the finished integrated circuit 940.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 9. The processes described by be enabled by EDA products (or EDA systems).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 1100 of FIG. 11, or host system 1007 of FIG. 10) may be used to store the programs and data structures that are used by some or all of the EDA products described herein, and products used for development of cells for the library and for physical and logical design that use the library.

Figure 10:
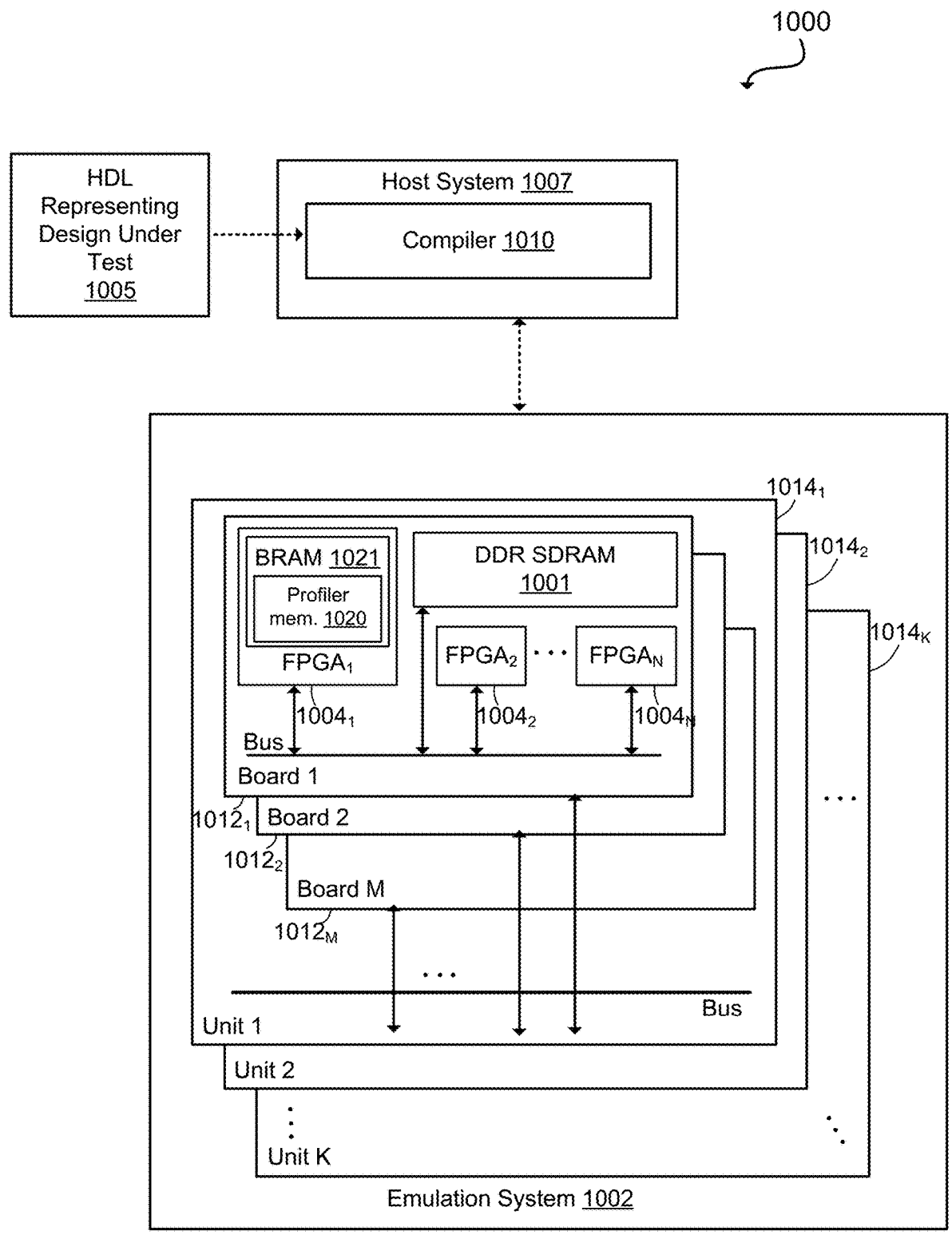
FIG. 10 depicts a diagram of an example emulation system in accordance with some embodiments of the present disclosure

FIG. 10 depicts a diagram of an example emulation environment 1000. The above discussed method may be implemented in the emulation environment 1000 to improve emulation throughput and to reduce memory primitive resource consumption. An emulation environment 1000 may be configured to verify the functionality of the circuit design. The emulation environment 1000 may include a host system 1007 (e.g., a computer that is part of an EDA system) and an emulation system 1002 (e.g., a set of programmable devices such as Field Programmable Gate Arrays (FPGAs) or processors). The host system generates data and information by using a compiler 1010 to structure the emulation system to emulate a circuit design. A circuit design to be emulated is also referred to as a Design Under Test ('DUT') where data and information from the emulation are used to verify the functionality of the DUT.

The host system 1007 may include one or more processors. In the embodiment where the host system includes multiple processors, the functions described herein as being performed by the host system can be distributed among the multiple processors. The host system 1007 may include a compiler 1010 to transform specifications written in a description language that represents a DUT and to produce data (e.g., binary data) and information that is used to structure the emulation system 1002 to emulate the DUT. The compiler 1010 can transform, change, restructure, add new functions to, and/or control the timing of the DUT.

The host system 1007 and emulation system 1002 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 1007 and emulation system 1002 can exchange data and information through a third device such as a network server.

The emulation system 1002 includes multiple FPGAs (or other modules) such as FPGAs $1004_1$ and $1004_2$ as well as additional FPGAs to $1004_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 1002 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory.

Depending on the length of the interconnections between different logic blocks, signals can arrive at input terminals of the logic blocks at different times and thus may be temporarily stored in the memory elements/devices.

FPGAs $1004_1$-$1004_N$ may be placed onto one or more boards $1012_1$ and $1012_2$ as well as additional boards through $1012_M$. Multiple boards can be placed into an emulation unit 10141. The boards within an emulation unit can be connected using the backplane of the emulation unit or any other types of connections. In addition, multiple emulation units (e.g., 10141 and 10142 through 1014K) can be connected to each other by cables or any other means to form a multi-emulation unit system.

For a DUT that is to be emulated, the host system 1007 transmits one or more bit-files to the emulation system 1002. The bit files may specify a description of the DUT and may further specify partitions of the DUT created by the host system 1007 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 1007 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic are included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 1007 and/or the compiler 1010 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 1005 into gate level logic. A profiler memory 1020 may be mapped by the compiler 1010 on physical memory resources, for example, in block memory (BRAM) 1021 on one or more FPGAs $1004_1$ to $1004_N$ of the emulation system 1002 (or mapped on an external DDR memory 1001 connected to one or more FPGAs $1004_1$ to $1004_N$), as shown in FIG. 10. The profiler memory 1020 identifies and stores the indexes (e.g., MSBs of the memory addresses) of unique pages accessed during emulation of the DUT 1005 in each of the test sequences (of all the test sequences) used during an emulation cycle. In subsequent emulation runs, a sparse memory may be created in one or more FPGAs $1004_1$ to $1004_N$ of the emulation system 1002 (e.g., using BRAM integrated in the one or more FPGAs $1004_1$ to $1004_N$) based on the maximum number of unique pages used by all the test sequences during the emulation cycle. For a DUT that is to be emulated, the design synthesizer sub-system receives a description of the DUT. If the description of the DUT is fully or partially in HDL (e.g., RTL or other level of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 11:
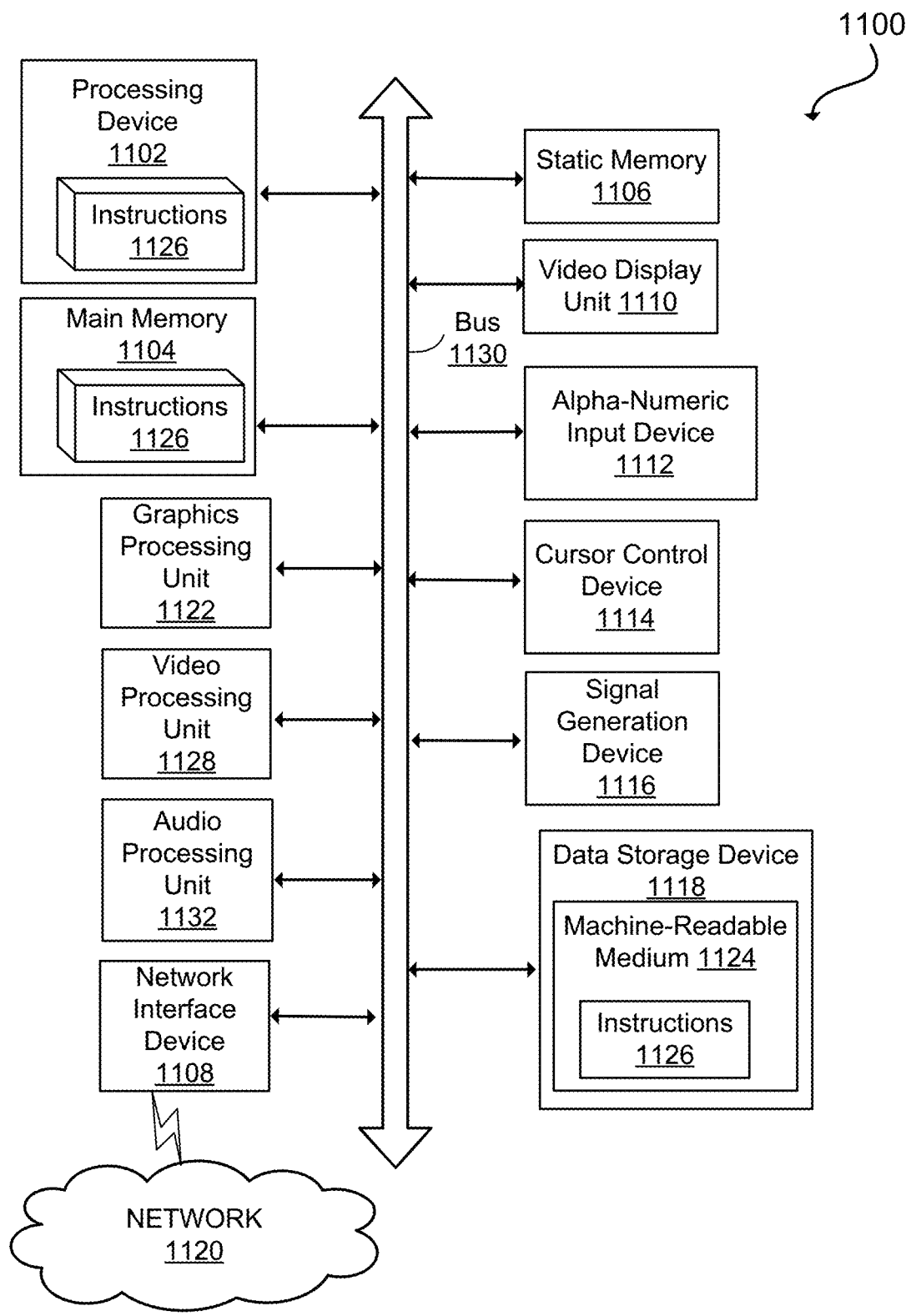
FIG. 11 depicts a diagram of an example computer system in which embodiments of the present disclosure may operate.

FIG. 11 illustrates an example machine of a computer system 1100 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

Processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1024 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for determining a sparse memory size during emulation, the method comprising:
    determining, by a profiler memory coupled to a user memory, that one or more pages of the user memory are used by a first test sequence of a testbench during the emulation, wherein the user memory is divided into a plurality of pages;
    identifying, by the profiler memory, a first set of page indexes of the one or more pages of the user memory used by the first test sequence based on mapping a page index of the first set of page indexes in the user memory to a corresponding address in the profiler memory;
    determining a number of unique pages of the user memory that are used by the first test sequence for the emulation based on the first set of page indexes and the corresponding addresses; and
    determining, by a processor, the sparse memory size for the user memory based on the number of unique pages of the user memory that are used by the testbench for the emulation and a page size of the user memory.

2. The method of claim 1, further comprising:
    storing, by the profiler memory, the first set of indexes in a storage device;
    determining, by the profiler memory, that one or more pages of the user memory are used by a second test sequence of the testbench for the emulation;
    identifying, by the profiler memory, a second set of indexes of the one or more pages of the user memory used by the second test sequence; and
    determining a maximum number of unique pages of the user memory that are used by the first and second test sequences for the emulation,
    wherein the determining the sparse memory size for the user memory is based on the maximum number of unique pages of the user memory that are used by the first and second test sequences of the testbench for the emulation and the page size of the user memory.

3. The method of claim 1, wherein the profiler memory has a same number of ports as the user memory and the ports in the profiler memory have one to one correspondence to the ports of the user memory.

4. The method of claim 3, wherein all ports in the profiler memory are write-only ports, wherein a data port of the profiler memory is connected to a voltage, and wherein an enable port of the profiler memory ports is connected to an enable port of the user memory ports.

5. The method of claim 1, wherein a page of the plurality of pages of the user memory comprises a fixed-length contiguous block of memory of size $2^n$.

6. The method of claim 5, wherein each address of a plurality of addresses in the profiler memory corresponds to the page of the plurality of pages in the user memory.

7. The method of claim 6, wherein the method further comprises:
    based on determining that the one or more pages of the user memory are used by the first test sequence for the emulation, setting, by the profiler memory, data bits of one or more addresses in the profiler memory that correspond to the one or more pages of the user memory to 1.

8. The method of claim 1, wherein a depth of the profiler memory is a same as the number of unique pages in the user memory and a width of the profiler memory is one bit.

9. The method of claim 1, wherein the profiler memory determines that the pages of the user memory are used by the first test sequence during the emulation by determining a high state of an enable port of the user memory that is connected to an enable port of the profiler memory.

10. The method of claim 1, wherein the profiler memory determines the number of unique pages of the user memory that are used by the first test sequence for the emulation based on the first set of indexes stored in a storage device.

11. An emulation system comprising:
    a processor;
    a field programmable gate array (FPGA);
    a user memory comprising a plurality of ports and connected to the FPGA; and
    a profiler memory comprising a plurality of ports and coupled to the user memory, an address port from among the plurality of ports of the profiler memory being connected to an address port of the plurality of ports of the user memory, wherein the profiler memory is configured to:
        track most significant bits (MSB) of one or more addresses of the user memory accessed by the FPGA in response to a first test sequence of a testbench during an emulation; and
        determine page indexes of one or more pages of the user memory associated with the one or more addresses of the user memory accessed by the FPGA in response to the first test sequence, and
    wherein the processor is configured to determine a sparse memory size for the user memory based on the page indexes of the one or more pages of the user memory associated with the one or more addresses of the user memory accessed by the FPGA in response to one or more test sequences of the testbench,
    wherein the user memory is divided into a plurality of pages, and
    wherein each page in the user memory is mapped to a corresponding address in the profiler memory.

12. The emulation system of claim 11, wherein the profiler memory is further configured to:
- track most significant bits (MSB) of one or more addresses of the user memory accessed by the FPGA in response to a second test sequence of the testbench for the emulation; and
- determine page indexes of one or more pages of the user memory associated with the one or more addresses of the user memory accessed by the FPGA in response to the second test sequence.

13. The emulation system of claim 12, wherein the processor is further configured to:
- determine a maximum number of unique pages of the user memory that are accessed by the FPGA in response to the first and second test sequences for the emulation based on a first set of indexes of the one or more pages of the user memory used by the first test sequence,
- wherein the sparse memory size for the user memory is determined based on the maximum number of unique pages of the user memory that are accessed by the FPGA in response to the first and second test sequences of the testbench for the emulation and a page size of the user memory.

14. The emulation system of claim 11, wherein each of the plurality of ports of the profiler memory corresponds to a port of the plurality of ports of the user memory, and wherein the profiler memory has a same number of ports as the user memory.

15. The emulation system of claim 11, wherein the plurality of ports in the profiler memory are write-only ports, wherein a data port of the plurality of ports of the profiler memory is connected to a voltage, and wherein an enable port of the plurality of ports of the profiler memory is connected to an enable port of the plurality of ports of the user memory.

16. The emulation system of claim 11, wherein the processor is further configured to:
- determine a maximum number of unique pages of the user memory that are accessed by the FPGA in response to the first test sequence for the emulation based on the determined page indexes; and
- determine the sparse memory size for the user memory based on the maximum number of unique pages of the user memory that are accessed by the FPGA in response to the testbench for the emulation and a page size of the user memory.

17. The emulation system of claim 11, wherein the profiler memory determines that the one or more pages of the user memory are accessed by the FPGA in response to the first test sequence during the emulation by determining a high state of an enable port from among the plurality of ports of the user memory that is connected to an enable port of the plurality of ports of the profiler memory.

18. The emulation system of claim 17, wherein each address of a plurality of addresses in the profiler memory corresponds to the page of a plurality of pages in the user memory.

19. The emulation system of claim 11, wherein a page of the plurality of pages of the user memory comprises a fixed-length contiguous block of memory of size $2^n$.

20. A non-transitory computer readable medium comprising stored instructions, which when executed by a processor, cause the processor to:
- instantiate a profiler memory having a plurality of ports connected to corresponding ports of a user memory, the profiler memory being configured to:
  - determine that one or more pages of the user memory are accessed by a first test sequence of a testbench for an emulation;
  - track most significant bits (MSB) of one or more addresses of the user memory used in the first test sequence of the testbench for the emulation;
  - determine page indexes of the one or more pages of the user memory associated with the one or more addresses of the user memory used in the first test sequence;
  - identify a first set of indexes of the one or more pages of the user memory used by the first test sequence;
  - store the first set of indexes in a storage device;
  - determine a number of unique pages of the user memory that are used by the first test sequence for the emulation; and
  - determine a size of a sparse memory for the user memory based on the number of unique pages of the user memory that are used by the testbench for the emulation and a page size of the user memory,
- wherein the user memory is divided into a plurality of pages, and
- wherein each page in the user memory is mapped to a corresponding address in the profiler memory.

* * * * *